United States Patent
Pasveer et al.

(10) Patent No.: US 9,136,308 B2
(45) Date of Patent: Sep. 15, 2015

(54) ILLUMINATION DEVICE WITH POWER SOURCE

(75) Inventors: Willem Franke Pasveer, Dordrecht (NL); Herbert Lifka, Son (NL)

(73) Assignee: Koninklijke Philips N.V., Eindhoven (NL)

( * ) Notice: Subject to any disclaimer, the term of this patent is extended or adjusted under 35 U.S.C. 154(b) by 150 days.

(21) Appl. No.: 13/390,243

(22) PCT Filed: Aug. 30, 2010

(86) PCT No.: PCT/IB2010/053874
§ 371 (c)(1),
(2), (4) Date: Feb. 13, 2012

(87) PCT Pub. No.: WO2011/027277
PCT Pub. Date: Mar. 10, 2011

(65) Prior Publication Data
US 2012/0139424 A1 Jun. 7, 2012

(30) Foreign Application Priority Data
Sep. 1, 2009 (EP) .................................... 09169124

(51) Int. Cl.
*G09G 3/10* (2006.01)
*H01J 1/62* (2006.01)
*H01L 27/28* (2006.01)
*H01L 51/52* (2006.01)
*H01L 27/32* (2006.01)

(52) U.S. Cl.
CPC .......... *H01L 27/288* (2013.01); *H01L 51/5271* (2013.01); *H01L 27/3281* (2013.01); *H01L 2251/5361* (2013.01)

(58) Field of Classification Search
USPC ........ 315/167, 169.1; 313/498, 504, 506, 512
See application file for complete search history.

(56) References Cited

U.S. PATENT DOCUMENTS

| 6,028,327 | A  | * | 2/2000  | Mizoguchi et al. ............ 257/98 |
| 6,559,594 | B2 | * | 5/2003  | Fukunaga et al. ............ 313/506 |
| 7,317,210 | B2 |   | 1/2008  | Brabec et al. |
| 7,339,636 | B2 | * | 3/2008  | Voloschenko et al. .......... 349/61 |
| 7,431,470 | B2 |   | 10/2008 | Coleiro |
| 7,750,561 | B2 | * | 7/2010  | Aziz et al. ..................... 313/506 |
| 7,796,320 | B2 | * | 9/2010  | Yang et al. .................... 359/245 |
| 8,487,527 | B2 | * | 7/2013  | Aziz et al. ..................... 313/504 |
| 2004/0027059 | A1 | * | 2/2004 | Tsutsui ........................ 313/504 |
| 2005/0023975 | A1 |   | 2/2005 | Lee et al. |
| 2005/0146874 | A1 |   | 7/2005 | Cech et al. |
| 2006/0012310 | A1 | * | 1/2006 | Chen et al. ................. 315/169.3 |
| 2006/0091797 | A1 | * | 5/2006 | Tsutsui et al. ................ 313/506 |

(Continued)

FOREIGN PATENT DOCUMENTS

| DE | 202006005427 | U1 | 6/2006 |
| DE | 102005057699 | A1 | 5/2007 |
| EP | 1610287 | A1 | 12/2005 |
| GB | 2452737 | A | 3/2009 |

(Continued)

*Primary Examiner* — Tung X Le
(74) *Attorney, Agent, or Firm* — Meenakshy Chakravorty

(57) ABSTRACT

The invention relates to an illumination device (1000) comprising an at least partially transparent solar cell (200) that is arranged at the back side of an at least partially transparent light source (100). Preferably, the light source (100) is an OLED that is structured into a plurality of electroluminescent zones (131) and inactive zones (132). The electroluminescent zones are preferably aligned with reflective zones (311) of a mirror layer (310) that is disposed between the light source (100) and the solar cell (200).

20 Claims, 1 Drawing Sheet

(56) References Cited

U.S. PATENT DOCUMENTS

| | | |
|---|---|---|
| 2006/0207192 A1 | 9/2006 | Durham |
| 2007/0069634 A1 | 3/2007 | Carmon et al. |
| 2008/0216418 A1 | 9/2008 | Durham |
| 2009/0108757 A1 | 4/2009 | Lee et al. |
| 2010/0237374 A1 | 9/2010 | Chu et al. |
| 2011/0132449 A1* | 6/2011 | Ramadas et al. ............ 136/256 |

FOREIGN PATENT DOCUMENTS

| | | |
|---|---|---|
| JP | 62188197 A | 8/1987 |
| JP | 10149880 A | 6/1998 |
| JP | 2002008851 A | 1/2002 |
| JP | 2004140122 | 5/2004 |
| JP | 2004142292 A | 10/2006 |
| WO | 2008017986 A2 | 2/2008 |

* cited by examiner

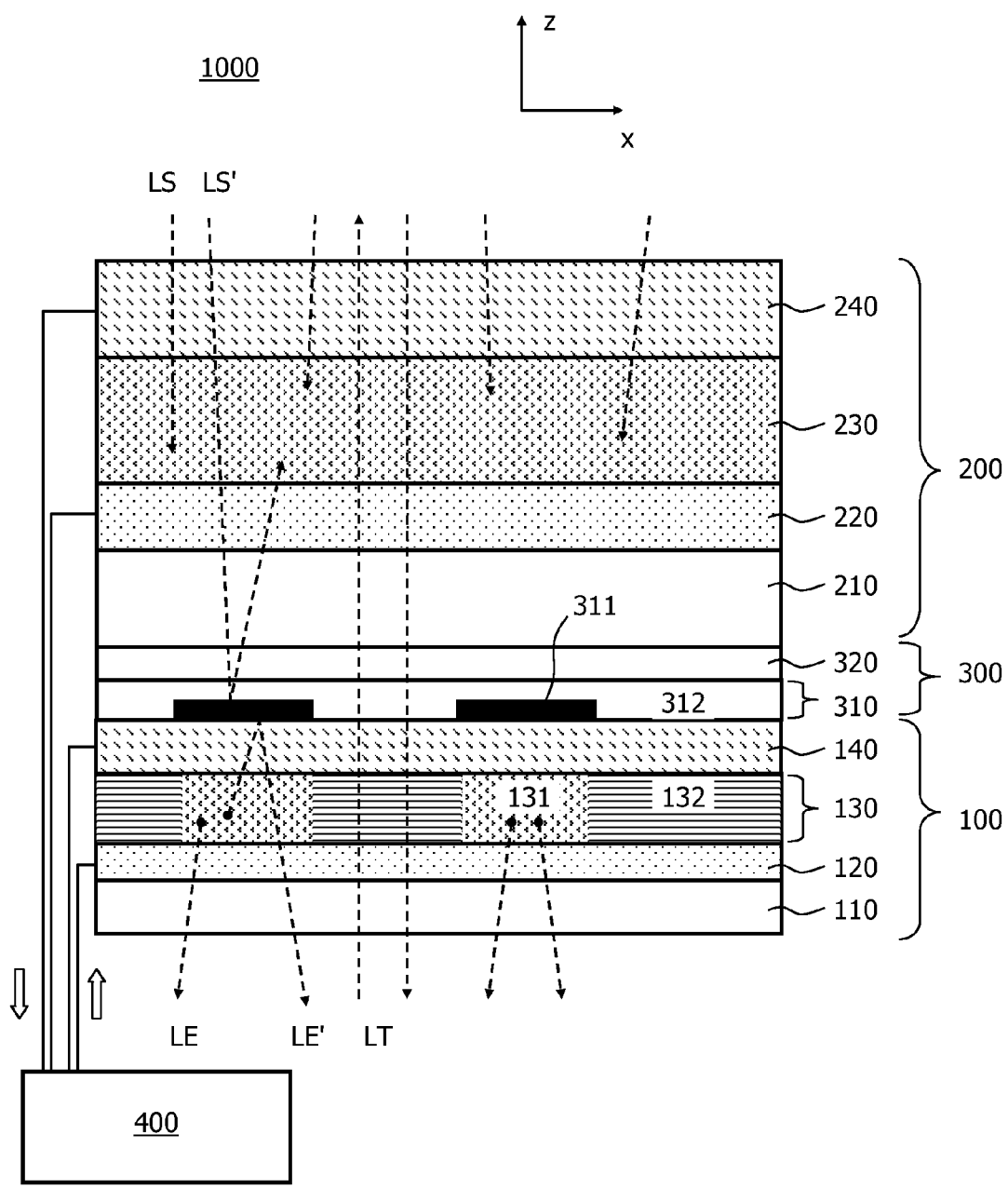

ILLUMINATION DEVICE WITH POWER SOURCE

FIELD OF THE INVENTION

The invention relates to an illumination device comprising solar cells for power generation.

BACKGROUND OF THE INVENTION

From the WO 2008/017986 A2, an illumination device is known that comprises an integrated arrangement of a battery with an organic solar cell on one side and an organic light emitting diode (OLED) on the other side.

SUMMARY OF THE INVENTION

Based on this background, it was an object of the present invention to provide an alternative illumination device with a power source that is particularly suited for outdoor off-grid illumination, for example in street lighting applications.

This object is achieved by an illumination device according to claim 1. Preferred embodiments are disclosed in the dependent claims.

The illumination device according to the present invention comprises the following components:

a) An at least partially transparent light source having a front side and a back side. The term "transparent" is to be understood with respect to a given relevant part of the electromagnetic spectrum, which part typically comprises wavelengths emitted by the light source and wavelengths of the environmental light. Moreover, an object shall be called "(partially) transparent" if it has an overall transparency of at least 10%, preferably at least 50%, most preferably at least 90% in the aforementioned relevant spectral range.

b) An at least partially transparent solar cell that is arranged at said back side of the light source. The term "solar cell" shall denote any device that is capable to convert electromagnetic radiation into electrical energy, particularly radiation in the range from ultraviolet (UV) to infrared (IR). Preferably, the solar cell is directly or via intermediate layer(s) materially bonded to the back side of the light source.

By combining two (at least partially) transparent components, i.e. the light source and the solar cell, the above illumination device as a whole may at least partially be transparent. This helps to give the illumination device a decent appearance even if the area covered by the light source and/or the solar cell is comparatively large, as it may often be necessary to achieve sufficient solar power collection and/or illumination. Furthermore, the integrated design with the light source and the solar cell being arranged back-to-back additionally helps to provide a compact appearance. Thus also large configurations can be realized as they are for example required in street lighting applications.

In general, the light source of the illumination device may be powered by any suitable electrical power source, for example by the public grid. Similarly, the electrical energy that is generated by the solar cell during exposure to light (typically sunlight) may be supplied to any consumer at hand. Preferably, the illumination device comprises however an energy storage, for example a rechargeable battery, that is coupled to both the solar cell and the light source. Thus electrical energy which is generated by the solar cell during daytime may be stored in the energy storage until it is taken from there at night to drive the light source. It is to be understood that the energy storage will typically comprise suitable control circuits for such functions, i.e. circuits which control charging and discharging of the storage in dependence on the available or required electrical power (and possibly further parameters like environmental illumination conditions). Such circuits are known to a person skilled in the art. The energy storage may be disposed at any convenient place, particularly remote from the light source and the solar cell (being connected to them via electrical leads).

In many applications, artificial illumination is required only at one side of the illumination device while external light energy reaches the solar cell from the opposite side. In the case of street lighting, sunlight reaches the illumination device for example from the top side, while artificial light has to be emitted to the bottom side. In this and similar cases, it is preferred that the light source is designed such that it emits light only through its front side. Hence no light is emitted through the back side of the light source in directions where it is not needed or perhaps even unwanted.

According to another preferred embodiment of the invention, the illumination device comprises a mirror layer that is partially transparent and disposed somewhere between the light source and the solar cell (including positions where it is integrated into one of these components). As its name indicates, the mirror layer is (partially) reflective on at least one side. If the side facing the solar cell is reflective, light that has passed the solar cell will be reflected back into the solar cell, thus increasing the efficiency of energy conversion. If the side facing the light source is reflective, light leaving the light source through its back side can be reflected back into the light source such that it will finally be emitted through the front side. In this way, more (or even all) emission can be directed to the front side. It should be noted that the mirror layer might conceptually also be considered as an integrated component of the light source or the solar cell, respectively.

Most preferably, the aforementioned mirror layer is reflective on both sides, i.e. the side facing the solar cell as well as the side facing the light source. This allows to achieve the described advantages for both the energy conversion and the light emission.

According to a further development of the illumination device with a mirror layer, said mirror layer has a structure with at least one nontransparent zone and at least one transparent zone. The transparent zone guarantees in this case that the mirror layer as a whole is (partially) transparent. In the nontransparent zone, the reflectivity of the mirror layer can be realized by making this zone reflective on its top and/or bottom side.

In the aforementioned case, the light source preferably comprises an organic light emitting diode (OLED) unit with the following components:

- A first transparent electrode layer. This layer will in the following be briefly called "anode" to indicate that it is usually driven with a lower electrical potential than its counter-electrode (the "cathode") during the operation of the light source. In general, this denomination shall however not imply any restrictions with respect to the design of the first electrode layer.
- A second transparent electrode layer which will be called "cathode" in the following. To this layer, analogous remarks as for the anode apply.
- An organic layer that is disposed between the anode and the cathode. Appropriate organic materials that can generate light by electroluminescence are well known from conventional OLEDs. It should further be noted that the term "layer" shall comprise multilayer structures, particularly in the case of the organic layer.

The organic layer, the anode, and the cathode shall commonly constitute a functional structure in the organic layer which comprises at least one electroluminescent zone and at least one not-electroluminescent zone, the latter being called "inactive zone" in the following. Moreover, the mirror layer at the back side of the light source shall have a structure with at least one nontransparent zone that is aligned to an electroluminescent zone of the organic layer, and at least one transparent zone that is aligned to an inactive zone of the organic layer. It should be noted that a zone is called "nontransparent" if its transparency is less than 5%, preferably approximately 0% in the relevant spectral range. The mirror layer may for instance be disposed immediately or indirectly on any side of the anode or cathode, or it may be embedded or integrated into the anode or cathode.

The described "structured design" of the OLED light source and the mirror layer has the advantage that it can at the same time be transparent (at the points where a transparent zone is aligned with an inactive zone) and have a primary or even single direction of light emission (at the points where a nontransparent zone blocks light emission of its associated electroluminescent zone). Depending on the particular dimensions and mutual arrangements of the structures of the organic layer and the mirror layer, these properties can be adjusted over a wide range. Thus the transparency of the whole light source can for example be affected via the relative size of the transparent zones in the mirror layer. Moreover, the ratio of the active emissions through the anode and the cathode can be adjusted in the range between 1:1 (equal emissions through both electrodes) and 0:1 (emission to one side only).

In the following, various preferred embodiments of the "structured design" of the OLED light source and/or the mirror layer will be described in more detail.

According to a first preferred embodiment of the "structured design", the structures of the organic layer and of the mirror layer are in global alignment and/or locally perfect alignment.

"Global alignment" means that the light source has a given "alignment axis" (typically an axis perpendicular to the anode, cathode and organic layer), and that, in the direction of this alignment axis, each electroluminescent zone is in line with a nontransparent zone and each inactive zone is in line with a transparent zone. The patterns of electroluminescent/inactive zones on the one hand and transparent/nontransparent zones on the other hand thus follow the same raster though the shapes of the zones may locally deviate from each other.

"Locally perfect alignment" means that, in the direction of this alignment axis, each point of at least one electroluminescent zone is in line with a point of a nontransparent zone and/or that each point of an inactive zone is in line with a point of a transparent zone. At least one electroluminescent/inactive zone and at least one transparent/nontransparent zone are therefore both aligned and geometrically congruent.

A "structured design" with a global and locally perfect alignment of structures can for example be used to block the entire emission of the light source in one direction.

In an alternative embodiment, the structures of the organic layer and the mirror layer are only partially aligned. At least one electroluminescent zone can for example not be in line with a nontransparent zone with respect to the aforementioned alignment axis of the light source, thus achieving some emission in a secondary direction.

In a preferred embodiment of the structured mirror layer, the nontransparent zone of the mirror layer is reflective on the side that faces the organic layer. Light generated in the corresponding electroluminescent zone of the organic layer is then reflected back to said layer such that it is not lost but emitted into a desired direction.

The nontransparent zones of the mirror layer may preferably comprise a metal, for example a metal selected from the group consisting of silver (Ag), aluminum (Al), copper (Cu) and gold (Au) (but not restricted to only these metals).

The nontransparent zones of the mirror layer will typically cover about 10% to 90% of the area of the mirror layer. The smaller the covered percentage is, the higher is the transparency of the light source.

The nontransparent zones may quite arbitrarily be shaped and distributed in the area of the mirror layer. Preferably, they are shaped as (elliptical, circular, rectangular, and other geometrical shapes) dots or stripes and distributed in a regular or irregular (random) pattern.

The transparent and/or the nontransparent zones of the mirror layer may typically have a (mean) diameter ranging between 1 micron (lower limit of conventional lithography) and 100 micron. In this context, the term "diameter" has to be defined appropriately for non-circular shapes of the zones, for example as the diameter of the largest circle that can completely be inscribed into said shape. The diameter of the transparent and/or nontransparent zones is preferably chosen such that the mirror layer can readily be manufactured and that undesired optical effects (e.g. noticeable patterns or diffraction) are avoided. Larger diameters or larger graphical structures can be used as well, or in combination with the smaller diameter zones, in order to achieve visually pleasing, visible patterns.

The functional structure of electroluminescent and inactive zones in the organic layer can be achieved in different ways. Thus it is for example possible that the material of the organic layer itself is physically structured to show different electroluminescent properties in these zones. Another possibility is that the anode and/or the cathode is structured into zones of different charge-carrier injection properties; zones with normal injection properties will then yield the electroluminescent zones in the (materially homogenous) organic layer, while zones with reduced or no injection properties will yield the inactive zones in the organic layer.

Apart from the particular structured design explained above, the light source of the illumination device may in general preferably comprise an OLED which generates light by electroluminescence of an organic layer in a way that is well-known from organic light emitting diodes (OLEDs).

In the illumination device in general, the solar cell may particularly comprise an organic solar material that is disposed between two electrode layers. Suitable organic solar materials/cells are for example known from the WO 2008/017986 A2 or the US-2005/0023975 A1. Organic solar cells are similar to OLEDs except that they convert light energy into electrical energy and not vice versa.

The illumination device may optionally be flexible, thus allowing to be fitted to some desired shape (e.g. that of a carrier or frame).

Moreover, the illumination device will typically comprise additional structures and/or layers to provide for example mechanical stability or a sealing against the environment. In particular, it may comprise a flexible substrate, preferably a substrate with a water barrier.

According to another embodiment of the invention, the light source comprises not just one multilayer OLED unit with an anode, cathode and organic layer, but a stack of several such multilayer OLED units. Each of these multilayer units comprises an anode, a cathode and an organic layer, wherein the organic layers of the different units have different emission characteristics, for example emission peaks in the red, green and blue range, respectively. Moreover, the organic layer of at least one of the multilayer units may be functionally structured into electroluminescent zones and inactive zones to achieve the above described interaction with a structured mirror layer. Preferably, all organic layers of the multi-layer units are functionally structured into electroluminescent zones and inactive zones, wherein the corresponding structures may be the same and aligned to each other or different and not aligned.

The illumination device according to the invention may favorably be used in many different applications, including inter alia street lighting or lighting of windows (e.g. of shops or offices, for advertisement, or of autonomous bus stops). Moreover, it can be used as a coating, for example of greenhouses, or as a coating for tables.

Accordingly, a separate aspect of the invention relates to a piece of furniture, for example a table, comprising an illumination device with a light source and a solar cell. Hence outdoor products like garden tables can be provided that light up during darkness, wherein the solar cell provides an autonomous power supply. In case of a table, the illumination device preferably constitutes the surface of use of the table (i.e. the surface upon which objects are placed) or at least a part of it. Most preferably, the piece of furniture may comprise an illumination device of the kind described above, i.e. having an at least partially transparent light source coupled to an at least partially transparent solar cell.

BRIEF DESCRIPTION OF THE DRAWINGS

These and other aspects of the invention will be apparent from and elucidated with reference to the embodiment(s) described hereinafter. These embodiments will be described by way of example with the help of the accompanying drawing in which:

FIG. 1 schematically illustrates a section through an illumination device comprising a light source and a solar cell according to the present invention.

DESCRIPTION OF PREFERRED EMBODIMENTS

Known off-grid solar powered street lighting products all have the typical feature of a large solar cell on top, giving them a bulky, unpleasant look. It is therefore proposed here to combine a (partially) transparent solar cell and a (partially) transparent light source as one device. This provides a novel off-grid street lighting luminaire while increasing the efficiency of both the light source and the solar cell.

FIG. 1 schematically illustrates an illumination device 1000 designed according to the above principles. The illumination device 1000 is composed of
  a light source 100, here realized by an OLED unit having a front side (bottom surface of layer 110 in the FIGURE) and a back side (top surface of layer 140 in the FIGURE);
  an solar cell 200, here realized as an organic solar cell;
  intermediate layers 300, comprising a mirror layer 310 and a glue layer 320;
  an energy storage 400 (battery) to which the solar cell and the light source are connected.

In the following, the light source 100 with the mirror layer 310 on its back side will be described in more detail. During manufacturing, these components will typically be processed first. Seen in the positive z-direction of the corresponding coordinate system, the light source 100 comprises the following sequence of layers:
  A transparent substrate 110, for example made from glass or a transparent plastic with a water barrier. The substrate provides mechanical stability and protects the sensitive optoelectronic layers.
  A first transparent electrode layer 120, called "anode", that may for example consist of indium tin oxide (ITO), doped zinc-oxide or an organic layer such as PEDOT:PSS, possibly in combination with a fine metal grid structure to lower the effective sheet resistance.
  An organic layer 130 that is functionally (and, in this embodiment, also physically) structured into electroluminescent zones 131 and inactive (i.e. not electroluminescent) zones 132, wherein said zones are arranged next to each other in x-direction and extend through the complete organic layer in z-direction. In the electroluminescent zones 131, light is generated by the processes known from conventional OLEDs when electrons and holes injected into this layer from different sides recombine. The inactive zones 132 typically consist of modified material of the electroluminescent zones 131. In general, the inactive zones might however consist of a completely different (organic or inorganic) material.
  A second transparent electrode layer 140, called "cathode", that is for example constituted by a thin layer of silver (Ag).

The "mirror layer" 310 that is disposed on the back side of the light source 100 consists of a pattern of nontransparent zones 311 and transparent zones 312. In the shown example, the structure of the mirror layer 310 is in global and locally perfect alignment with the structure of the organic layer 130, wherein the alignment is judged with respect to a given alignment direction (z-direction in this embodiment). The nontransparent zones 311 preferably comprise a metal, for example Ag, Al, Cu or Au. They are embedded in a transparent material that protects the OLED unit from water and also constitutes the transparent zones 312, for example TFE (Thin Film Encapsulation). It should be noted that other arrangements of the mentioned components are possible, too. Thus the nontransparent zones 311 can for example be disposed on top of the transparent material 312. Moreover, the mirror layer may alternatively be integrated into the OLED unit 100 (e.g. between the organic layer 130 and the cathode 140).

When an appropriate voltage is applied between the anode 120 and the cathode 140, light will be generated in the electroluminescent zones 131. As indicated by light ray LE, a part of this light will immediately be directed to the substrate 110 and leave the light source 100 as desired through its front side.

As indicated by light ray LE', another part of the generated light will be emitted in the opposite direction (positive z-direction) towards the back side of the light source 100. Due to the nontransparent zones 311 of the mirror layer 310, an emission through the back side is however blocked. As the nontransparent zones 311 are typically reflective on their bottom side, the light ray LE' is not simply absorbed but instead reflected and will thus be able to leave the light source 100 through the front side, too.

As indicated by light rays LT, environmental light can freely pass through the illumination device 1000 in the transparent zones 312 of the mirror layer. As a consequence, the illumination device 1000 will appear (at least partially) transparent and have at the same time a dominant or primary direction of active light emission (negative z-direction).

The transparent organic solar cell 200 comprises (from top to bottom):
  a transparent cathode 240, for example thin Ag;
  organic solar scavenging material 230;
  a transparent anode 220, for example ITO;

a flexible transparent substrate (e.g. plastic) acting as sealing and a water barrier.

Via a glue 320 and the mirror layer 310, the solar cell 200 is bonded to the single side transmitting OLED unit 100 such that both components keep their flexible properties.

The organic layer 230 of the solar cell 200 converts incident light rays LS, typically of the sunlight, into electrical energy which is provided to the storage 400. Light rays LS' that happen to pass the solar cell may be reflected by the nontransparent dots 311 in the mirror layer 310 and then be converted by the organic layer 230. The nontransparent dots 311 can hence considerably increase the efficiency of the solar cell 200 as well as the optical out-coupling of the light source 100.

If the inactive material 132 of the organic electroluminescent layer 130 is changed into an isolator, the efficiency may even further be enhanced because leakage currents through these areas are prevented and hence more current is available for light generation.

It should be noted that the solar cell may be dimensioned larger than the OLED unit to capture more light. In this case the nontransparent dots 311 may still be applied in non-overlapping regions to have a more transparent solar cell. Similar remarks hold if the solar cell is smaller than the OLED unit.

A method for manufacturing an OLED unit 100 of the kind described above may comprise the following steps (executed in the listed or any other sequence):

Preparing a (completely) electroluminescent organic layer between two transparent electrode layers, i.e. an "anode" and a "cathode". This step corresponds to the well known fabrication of a usual OLED. It should be noted that the preparation may comprise the use of further layers, for example of a transparent substrate.

Structuring the aforementioned organic layer by deleting the electroluminescence locally in at least one zone to generate a structure of electroluminescent zones and inactive zones. Appropriate methods to destroy the electroluminescence in the organic layer, e.g. via infrared irradiation, are familiar to a person skilled in the art.

It should be noted that the treated zones shall be inactive with respect to electroluminescence but shall be/remain transparent.

A structured mirror layer may then be deposited (directly of indirectly) at the cathode such that at least one nontransparent zone of the mirror layer is (finally, i.e. in the finished OLED unit) aligned to an electroluminescent zone of the structured organic layer and that at least one transparent zone of the mirror layer is (finally) aligned to an inactive zone of the organic layer.

A preferred method to delete the electroluminescence locally in the organic layer is to irradiate the layer with light of a specific wavelength and a high intensity, for example an intensity of more than 10 MW/cm$^2$. Thus the organic materials can be affected, for example decomposed, in such a way that the chain of processes leading to electroluminescence is interrupted.

According to a preferred embodiment of the manufacturing method, the mirror layer is deposited at the cathode before the electroluminescence is locally deleted. In this case the structure of the mirror layer can be used as a kind of mask for the generation of the structure in the organic layer. The organic layer can for example be irradiated through the mirror layer such that the regions in the shadow of the nontransparent zones of the mirror layer are protected from the radiation and thus keep their electroluminescence. Advantages of this approach are a simplified irradiation scanning (full area) and an automatic/accurate alignment.

The invention that was explained above with respect to the example of FIG. 1 provides a new generation of off-grid solar powered luminaires, applicable e.g. for street lighting, window lighting etc. Due to the transparent properties, these luminaires will appear less obtrusive even if their size will be somewhat larger than that of traditional luminaires. Due to their flexible properties, the design freedom in terms of the shape of the luminaires may also be increased.

Finally it is pointed out that in the present application the term "comprising" does not exclude other elements or steps, that "a" or "an" does not exclude a plurality, and that a single processor or other unit may fulfill the functions of several means. The invention resides in each and every novel characteristic feature and each and every combination of characteristic features. Moreover, reference signs in the claims shall not be construed as limiting their scope.

The invention claimed is:

1. An illumination device, comprising
an at least partially transparent light source having a front side and a back side, said light source having at least one active zone and at least one inactive zone; and
an at least partially transparent solar cell that is arranged at said back side, the at least partially transparent solar cell including a transparent cathode layer,
wherein the illumination device has at least one non-transparent zone aligned to a respective active zone and at least one transparent zone aligned to a respective inactive zone.

2. The illumination device according to claim 1, further comprising an energy storage that is coupled to the light source and the solar cell.

3. The illumination device according to claim 1, wherein the light source is designed to emit light only through the front side.

4. The illumination device according to claim 1, further comprising a mirror layer that is partially transparent and disposed between the light source and the solar cell.

5. The illumination device according to claim 4, wherein the mirror layer is reflective on both sides.

6. The illumination device according to claim 4, wherein the mirror layer has a structure with at least one nontransparent zone and at least one transparent zone.

7. The illumination device according to claim 6, wherein the light source is an OLED unit and comprises:
an anode formed by a first transparent electrode layer;
a cathode formed by a second transparent electrode layer;
an organic layer that is disposed between the anode and the cathode;
wherein said organic layer, the anode, and the cathode constitute a structure in the organic layer with at least one electroluminescent zone and at least one inactive electroluminescent zone,
and wherein the mirror layer has a structure with the at least one nontransparent zone aligned to the at least one electroluminescent zone and the at least one transparent zone aligned to the inactive electroluminescent zone of the organic layer.

8. The illumination device according to claim 7, wherein the anode and/or the cathode is structured into zones of different charge-carrier injection properties.

9. The illumination device according to claim 6, wherein the nontransparent zones of the mirror layer comprise a metal.

10. The illumination device according to claim 6, wherein the nontransparent zones cover about 10% to 90% of the area of the mirror layer and/or are shaped as dots or stripes distributed in a regular or irregular pattern.

11. The illumination device according to claim 6, wherein the transparent zones and/or the nontransparent zones of the mirror layer have a diameter between about 1 µm and about 100 µm.

12. The illumination device according to claim 1, wherein the light source comprises an OLED.

13. The illumination device according to claim 1, wherein the solar cell comprises an organic solar material disposed between two electrode layers.

14. The illumination device according to claim 1, wherein the illumination device is flexible and/or comprises a flexible substrate with a water barrier.

15. A piece of furniture, comprising the illumination device according to claim 1.

16. An illumination device, comprising:
   an at least partially transparent light source having a front side and a back side;
   an at least partially transparent solar cell that is arranged at said back side; and
   a mirror layer that is partially transparent and disposed between the light source and the solar cell.

17. The illumination device according to claim 16, wherein the mirror layer is reflective on both sides.

18. The illumination device according to claim 16, wherein the mirror layer has a structure with at least one nontransparent zone and at least one transparent zone.

19. The illumination device according to claim 18, wherein the nontransparent zones cover about 10% to 90% of the area of the mirror layer and/or are shaped as dots or stripes distributed in a regular or irregular pattern.

20. The illumination device according to claim 16, wherein the illumination device is flexible and/or comprises a flexible substrate with a water barrier.

* * * * *